United States Patent
Yoshioka

(10) Patent No.: US 8,471,674 B2
(45) Date of Patent: Jun. 25, 2013

(54) SHUNT RESISTOR AND METHOD FOR MANUFACTURING THE SAME

(75) Inventor: Tadahiko Yoshioka, Nagano (JP)

(73) Assignee: Koa Corporation, Ina-shi (JP)

( * ) Notice: Subject to any disclaimer, the term of this patent is extended or adjusted under 35 U.S.C. 154(b) by 0 days.

(21) Appl. No.: 13/473,692

(22) Filed: May 17, 2012

(65) Prior Publication Data

US 2012/0229247 A1     Sep. 13, 2012

Related U.S. Application Data

(63) Continuation of application No. PCT/JP2010/071694, filed on Dec. 3, 2010.

(30) Foreign Application Priority Data

Dec. 3, 2009   (JP) ................................. 2009-275333

(51) Int. Cl.
    *H01C 7/00*     (2006.01)
(52) U.S. Cl.
    USPC .......................................... 338/49; 29/610.1
(58) Field of Classification Search
    USPC .......................................................... 338/49
    See application file for complete search history.

(56) References Cited

U.S. PATENT DOCUMENTS 4,720,697 A     1/1988   Bizzarri

FOREIGN PATENT DOCUMENTS

| JP | 61-120401 A | 6/1986 |
|---|---|---|
| JP | 5-82301 A | 4/1993 |
| JP | 5-79901 U | 10/1993 |
| JP | 6-224014 A | 8/1994 |
| JP | 2000-277302 A | 10/2000 |
| JP | 2008-47571 A | 2/2008 |
| JP | 2009-216620 A | 9/2009 |

OTHER PUBLICATIONS

International Search Report for PCT/JP2010/071694 on mailing date Mar. 1, 2011.

*Primary Examiner* — Kyung Lee
(74) *Attorney, Agent, or Firm* — Westerman, Hattori, Daniels & Adrian, LLP

(57) ABSTRACT

Provided is a shunt resistor which has an excellent accuracy of current detection and a small temperature drift as well as a compact structure, and improves the operability. The shunt resistor is provided with a resistance body (11), a pair of main electrodes (12, 12) separated from the resistance body, and a pair of voltage detection electrodes (13, 13) separated from the main electrodes. The voltage detection electrodes (13) are provided and fixed between the resistance body (11) and the main electrodes (12). The voltage detection electrode (13) is provided with a detection terminal (13*a*) to be connected to a terminal of a voltage detection circuit. The resistance body (11) has a columnar shape. The voltage detection electrode (13) and main electrode (12) are fixed to both end faces of the resistance body (11) in the length direction, so that they are opposing each other. The components are bonded by diffusion boding, friction bonding, wax bonding, etc., after abutting the bonding surfaces with each other.

10 Claims, 9 Drawing Sheets

SHUNT RESISTOR AND METHOD FOR MANUFACTURING THE SAME

TECHNICAL FIELD

The invention relates to a resistor, especially relating to a shunt resistor consisting of metal material that uses resistance alloy material as resistance body.

BACKGROUND ART

The shunt resistor is used for observing electrical charge and discharge of battery current and for preventing the battery trouble beforehand. The shunt resistor is excellent in current detection accuracy, small in current drift, and even if a large current is applied, excessive heat is not generated. The shunt resistor is used in a field where super-low resistance value such as 1 mΩ or less is required, and various structures of shunt resistors have been proposed (for example, refer to Japanese laid open patent publication 2009-216620).

The shunt resistor has cylindrical current terminals (electrodes) on both sides of resistance body, and the terminals are connected directly with cables. And the shunt resistor is used by welding voltage detection terminals to connection space of the current terminals. However structure of the resistor is not necessarily enough at super-low resistance value to be excellent in current detection accuracy and to reduce temperature drift.

SUMMARY OF INVENTION

Technical Problem

The invention has been made basing on above-mentioned circumstances. Therefore objects of the invention are to provide a shunt resistor and manufacturing method thereof, which is excellent in current detection accuracy, which is able to reduce temperature drift, which is able to make structure small and compact, and which improves operability to use.

Solution to Problem

The shunt resistor of the invention comprises a rod-shaped resistance body; a pair of rod-shaped electrodes separated from the resistance body; wherein end faces of the resistance body and the electrode are bonded. In addition, the electrode consists of a main electrode and a voltage detection electrode, and the voltage detection electrode is provided and bonded between the resistance body and the main electrode.

Also, method for manufacturing a shunt resistor of the invention comprises: preparing a rod-shaped resistance body and a pair of rod-shaped electrodes separated from the resistance body; and abutting faces of the electrodes to both end faces of the resistance body in length direction thereof so that end faces of the electrode and the resistance body are opposed each other, and fixing them.

According to the invention, each component can be machined easily, and high size accuracy can be obtained upon each component. And an excellent shunt resistor in electrical characteristics has been produced since steady current pathway has been achieved. Also, by inserting voltage detection electrode that has detection terminal for detecting voltage between the resistance body and the main electrode as a bonding part, since accuracy of position where voltage detection terminal is formed goes up, then accuracy of voltage detection goes up. In the resistor of super-low resistance value of about 0.1 mΩ, without receiving influence of resistance element of main electrode material, current detection at highly accurate resistance value and low temperature coefficient of resistance that the resistance body possesses becomes possible.

BRIEF DESCRIPTION OF DRAWINGS

FIG. 4A is an exploded perspective view of the resistor.
FIG. 4B is a perspective view at a stage where each component of the resistor has been bonded.
FIG. 4C is a view at a stage where holes have been formed at end faces. The upper of FIG. 4C is a perspective view, and the lower is a perspective view of cross-section, which includes center line.
FIG. 4D is a perspective view at a stage where flatness parts have been formed in the main electrodes.
FIG. 4E is a perspective view at a stage where voltage detection terminals have been fixed.
FIG. 4F is a perspective view, which shows an example of trimming the resistor.
FIG. 4G is a perspective view, which shows an example of mounting the resistor.

DESCRIPTION OF EMBODIMENTS

Figure 1:
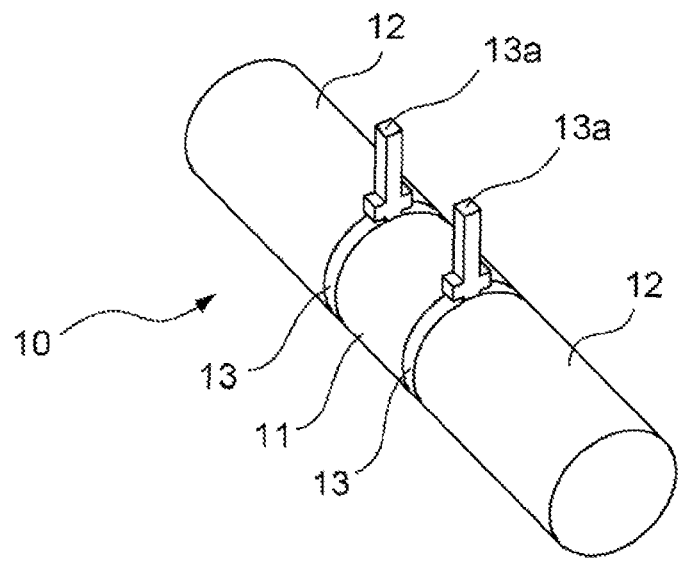
FIG. 1 is a perspective view of shunt resistor according to first embodiment of the invention.

Embodiments of the invention will be described below with referring to FIG. 1 through FIG. 14B. Like or corresponding parts or elements will be denoted and explained by same reference characters throughout views.

Figure 2:
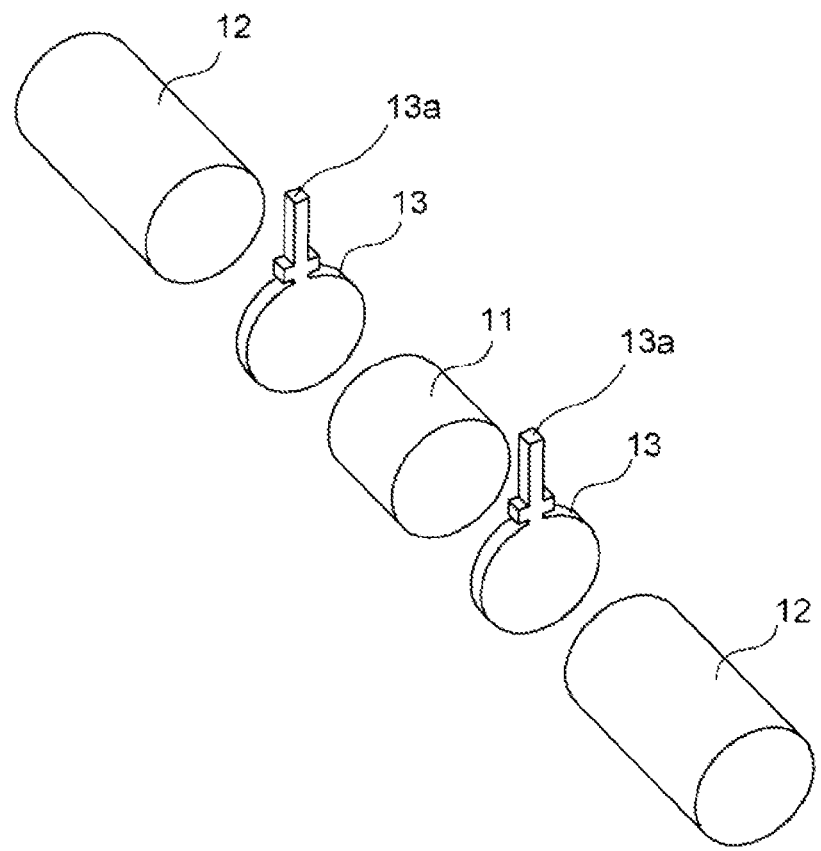
FIG. 2 is an exploded perspective view of the resistor.

FIG. 1 shows a shunt resistor of first embodiment of the invention, and FIG. 2 shows an exploded view thereof. The shunt resistor 10 is provided with a columnar resistance body 11 consisting of resistance alloy material such as Manganin, a pair of main columnar electrodes 12,12 consisting of highly conductive metal material such as copper, which is separated from the resistance body, and a pair of plate-type voltage detection electrodes 13,13 consisting of highly conductive metal material such as copper, which is separated from the main electrode. Voltage detection electrode 13 has a projection part projecting from the electrode 13, and a terminal of voltage detection circuit will be connected thereto by welding etc.

As shown in the Figure, voltage detection electrode 13 is provided and bonded between resistance body 11 and main electrode 12. And, end faces of plate-shaped voltage detection electrode 13 and end faces of columnar main electrode 12 are fixed to both end faces of columnar resistance body 11 in length direction so that they are opposed each other. Here, as to resistance body 11 and voltage detection electrode 12, and as to main electrode 12 and voltage detection electrode 13, each contacting face is abutted and bonded by pressure bonding, concretely, by diffusion bonding. And, the bonded faces are mechanically strong and electrically stable.

One concrete example of each component will be described. The diameter of resistance body 11 is about 8 mm $\phi$ and its length is about 10 mm. Then, resistance characteristics of resistance value being about 0.1 m$\Omega$ and temperature coefficient of resistance being about ±50 ppm/° C. is obtained. Moreover, thickness of voltage detection electrode 13 is about 0.7 mm, and end face of detection terminal 13$a$ composes the same face with end face of voltage detection electrode 13. Therefore, it becomes possible at detection terminal 13$a$ to detect voltage directly basing on resistance value and temperature coefficient of resistance of resistance body 11 without receiving influence by resistance element of copper material of the main electrode.

According to shunt resistor 10, since voltage detection electrode and detection terminal are an integral joint part, mounting process becomes simple. Moreover, since difference of fixed position of detection terminal 13$a$ can be suppressed, voltage detection of resistance body 11 at nearest position thereto becomes possible. This respect will be described later.

Moreover, since voltage detection electrode 13 becomes a part of electrode, it never comes off from joint parts, it excels also in durability, and change of resistance value with lapse of time becomes small. And, since there is no lapping part formed by electrodes and resistance body, but column-shaped as a whole, and electrode and resistance body are bonded over entire joint face, smooth current pathway and heat radiation route are obtained, and joint strength is also strong.

Since, according to shunt resistor of the invention, current pathway between both electrodes is straight, resistance can be calculated according to size of resistance body 11 even if simulation of finite element method etc. is not used, and resistor of high accuracy can be produced easily. That is, it becomes easy to design small shunt resistor because it can fix size of resistance body and copper electrode in consideration of requested resistance value and generation of heat. Further, as described later, since it becomes possible to form flatness part or male-screw or female-screw on electrodes, it becomes easy to connect with terminal or harness, and it is possible to make the resistor to be good operability to use.

Next, manufacturing method for shunt resistor 10 will be explained. First of all, resistance body 11, a pair of main electrodes 12,12 separated from the resistance body, and a pair of voltage detection electrodes 13,13 separated from the main electrode are prepared. Resistance body 11 is formed to be columnar by cutting long rod-shaped material consisting of Manganin etc. into a prescribed size to have end faces, that is, cut faces at both ends. Main electrode 12 is similarly formed to be columnar by cutting long rod-shaped material consisting of copper etc. into a prescribed size to have end faces, that is, cut faces at both ends. Voltage detection electrode 13 has plate-shaped part and detection terminal 13$a$ projecting from the plate-shaped part. The electrode 13 is formed by stamping sheet-shaped copper plate etc. to prescribed shape. Press processing or etching processing may be used for processing sheet-shaped copper plate.

Further, though an example of material for voltage detection electrode 13 is copper, however, one that metal film such as nickel is formed on surface of voltage detection electrode 13 may be used. By forming nickel film thereon, diffusion bonding becomes easy, bonding in nitrogen atmosphere becomes possible, and productivity improves. Formation of metal film to surface of voltage detection electrode 13 may process by using sheet-shaped copper-plate on which metal film is formed beforehand or by forming metal film after processing to shape of voltage detection electrode 13. In methods for forming the metal film, there is a method such as electrolysis or non-electrolysis plating.

Next, joint surface is ground. The joint surface consists of both end faces of resistance body 11, an end face of main electrode, and end faces of voltage detection electrodes bonding to resistance body 11 and main electrode 12. As for voltage detection electrode 13, when the surface is especially covered with a metal film, it is desirable to grind the joint surface before the metal film is formed. Bonding becomes stronger by using grinding material and grinding so that joint surface may enter a state near mirror surface. And, providing plate portion of voltage detection electrode 13 to each end face of resistance body in length direction at both ends, and fixing it between resistance body 11 and main electrode 12, so that end face of resistance body 11 and end face of main electrode are opposed. That is, end faces are abutted each other opposing face to face and they are fixed by diffusion bonding etc.

Explaining diffusion bonding (thermo compression bonding), main electrode 12, voltage detection electrode 13, resistance body 11, voltage detection electrode 13, and main electrode 12 are arranged in this order, and with applying prescribed pressure in axial direction, they are heated at 500-900° C. In almost entire joint surface of contacted metal material, since atom of each metal material diffuses mutually in joint interface, strong and homogeneous joint can be obtained. There is a resistance welding as other bonding method. In case of using resistance welding, main electrode 12, voltage detection electrode 13, resistance body 11, voltage detection electrode 13, and main electrode 12 are arranged in this order, and with applying prescribed pressure and prescribed current in axial direction, they are united each other by mainly contact resistance heat generation between joint materials.

It is desirable that bonding of resistance body, voltage detection electrodes, and main electrodes is done by using a method that can unite in entire joint surfaces like pressure bonding. Additionally, electron beam welding may be used, and, in this case, electron beam is irradiated to joint part of each metal material. Similarly, it is also possible to use laser welding like YAG laser for instance. However, in case of using YAG laser, there is a possibility that difference of current distribution is generated because it might not be able to get an enough joint to center of joint face though joint part can be welded in the surroundings.

Shunt resistor 10 shown in FIG. 1 is completed by the method explained above. As for resistance value, the majority is determined by the size of resistance body 11. In the invention, because advanced size accuracy can be achieved by using columnar resistance material, it is possible to control resistance value with high accuracy. Moreover, if resistance body is trimmed by cutting or grinding surface of resistance body 11, it becomes more highly accurate.

According to above-mentioned process, since voltage detection electrode and terminal of shunt resistor can be formed at a time, shunt resistor of high accuracy, of handling easy, of being good operability to use, can be produced by simple manufacturing method.

In this embodiment, an example of bonding plate-shaped voltage detection electrode and columnar main electrode to columnar resistance body is explained; however, these diameters may not necessarily be same. Moreover, it is also possible that a part or all of these materials are square pillar-shaped.

Figure 3:
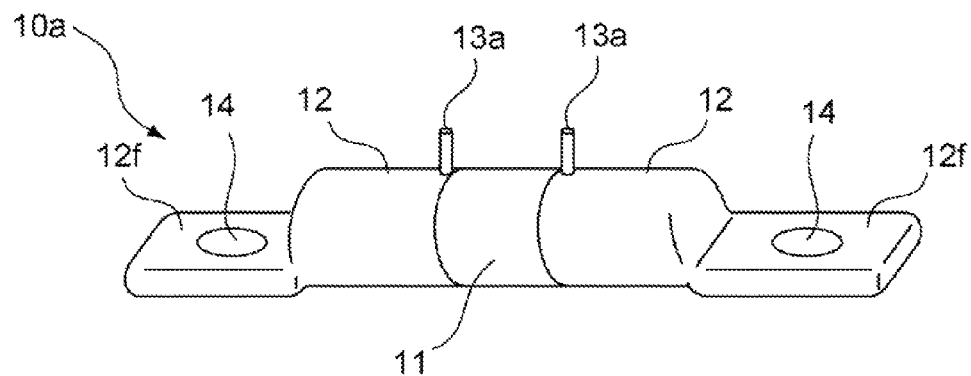
FIG. 3 is a perspective view of shunt resistor according to second embodiment of the invention.

FIG. 3 shows shunt resistor of second embodiment of the invention. The shunt resistor 10a has a structure that flatness part 12f,12f are formed at both ends of electrodes 12,12 that are columnar. The flatness part 12f has opening 14 therein. And, it forms a structure that bus bar connected with battery etc. can be connected and fixed to flatness part by using bolt and nut through opening 14. Opening 14 may be a screw hole, and may fix the bus bar to flatness part 12 by screw stop. Since flatness part 12f is formed, it becomes easy to connect and to fix with bus bar or tabular metal terminal fittings.

Figure 4A:
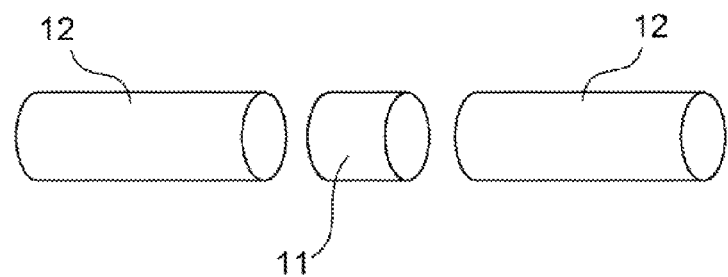
FIG. 4A-4G are views, which show manufacturing process and assembling according to second embodiment.
Figure 4B:
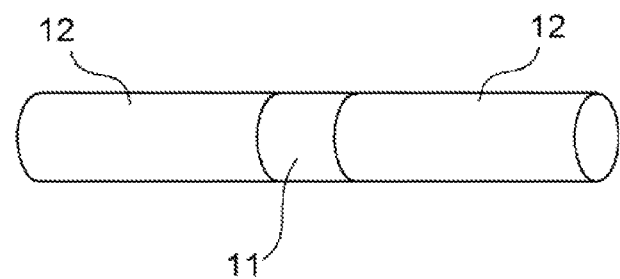

FIG. 4A-4F shows an example of manufacturing process of second embodiment. As shown in FIG. 4A and FIG. 4B, resistance body 11 consisting of alloy material for resistance body such as Manganin etc. and a pair of main electrodes 12,12 consisting of highly electric conductive metal such as copper separated from resistance body are prepared. Resistance body 11 and main electrode 12 are columnar materials of almost same diameter. Main electrodes 12,12 are abutted and bonded to both end faces of resistance body 11 in length direction, so that end face of resistance body 11 and end face of main electrode 12 are opposed each other.

For bonding resistance body 11 and main electrode 12, pressure bonding, concretely, friction pressure bonding method (friction welding) may be used. The friction pressure bonding method is a technology that rubbing materials to be bonded at high speed, softening materials by caused friction heat, and bonding them by applying pressure at the same time. As a result, strength can be secured, joint status of materials is excellent, and stabilization of resistance characteristics can be achieved. Concretely, resistance body is first fixed with jig, and main electrode material is fixed with other rotatable jig. While rotating main electrode material with about 3000/min-6000/min, pressing it against end face of resistance body under pressure of about 1 kN-10 kN, and continuing this for 0.1 seconds-10 seconds, end face of resistance body and end face of main electrode are bonded. Similarly, other main electrode is bonded to other end face of resistance body. And, burr caused in joint part is removed. As for bonding method, methods such as wax bonding may be used.

Figure 4C:
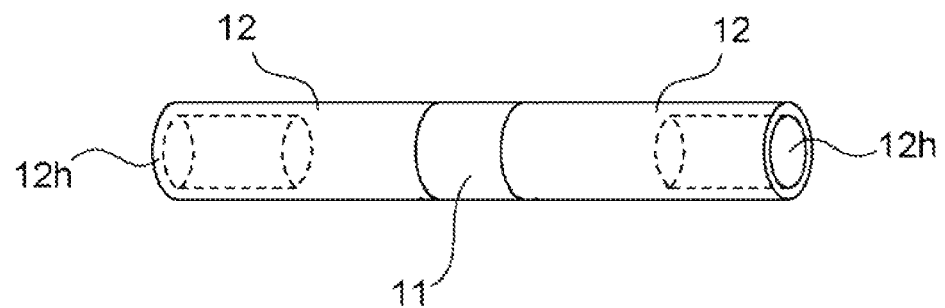
Figure 4C:
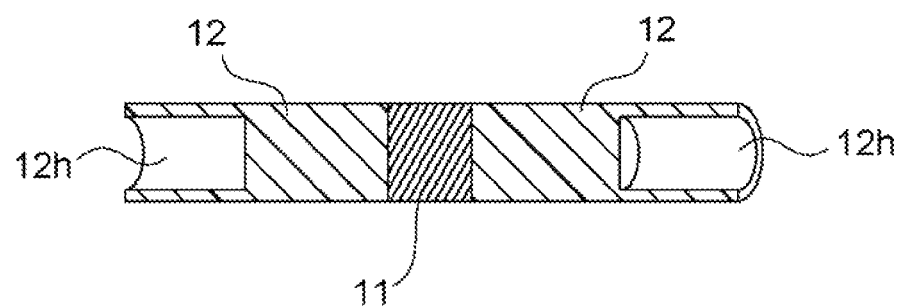
Figure 4D:
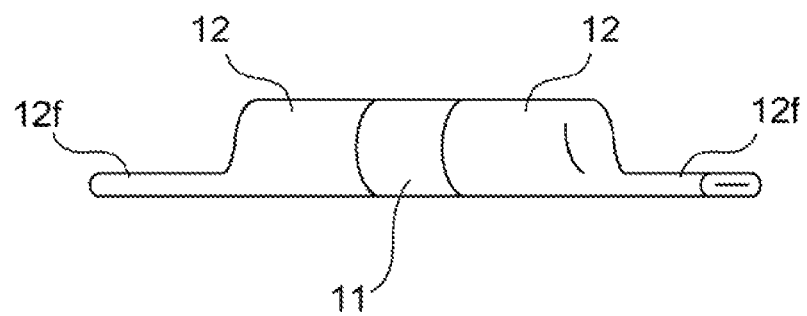

Next, as shown in FIG. 4C, hole 12h is formed at end faces of main electrodes 12,12. Depth of hole is adjusted in proportion to area of flatness part to be formed. Even though the hole need not necessarily be formed, by forming hole, it becomes easy to form the flatness part with press. And, flatness part 12f is formed by crushing the part where hole 12h was formed with the press. Opening 14 is formed in flatness part 12f. As shown in FIG. 4D, by forming position of flatness part at lower side of the resistor, bottom face of shunt resistor becomes almost flat, and it is convenient when mounting. Therefore, a structure having flatness part 12f,12f at both ends of electrodes 12,12 and to have opening 14 in flatness part 12f is obtained. Further, flatness part 12f and opening 14 may be formed by cutting. Moreover, as other uses of hole 12h, by inserting lead wire that is current pathway into hole 12h and crushing hole 12h (kashime), it is also possible to fix lead wire and main electrode 12 being connected.

Figure 4E:
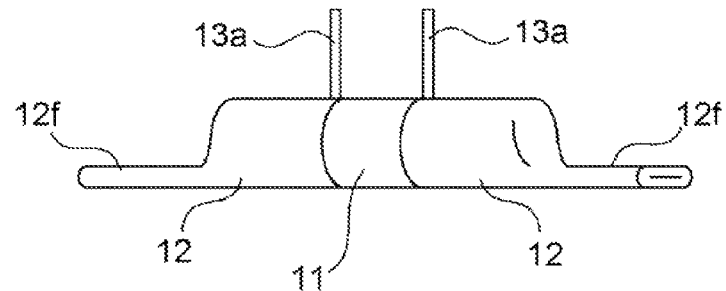
Figure 4F:
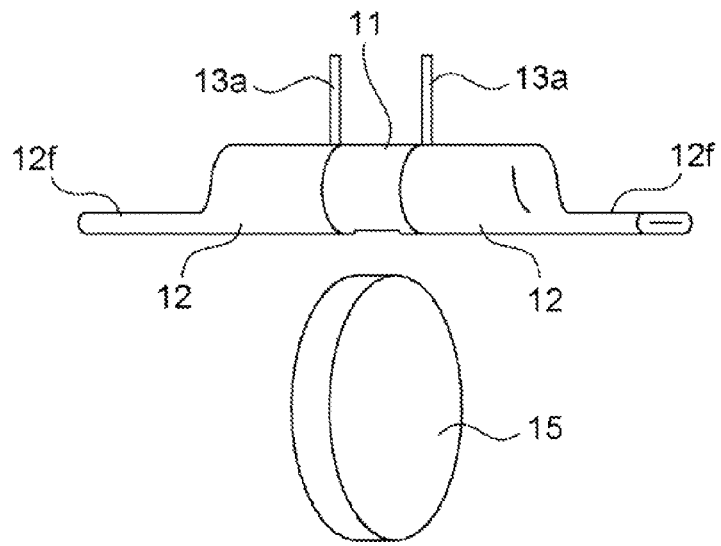
Figure 4G:
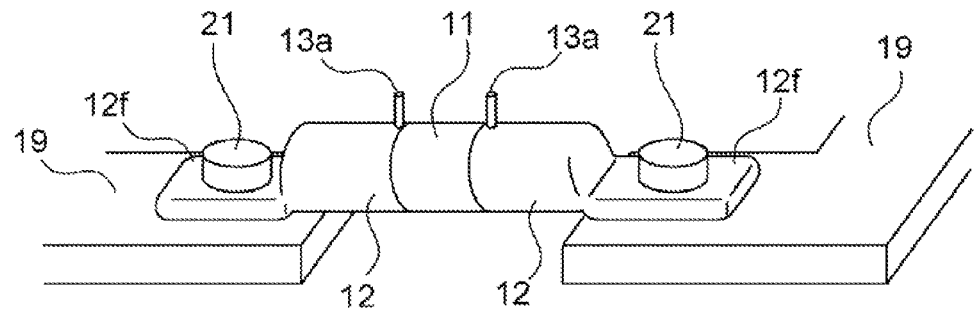

Next, as shown in FIG. 4E, detection terminal 13a is welded to main electrode 11. A hollow may be formed beforehand for positioning detection terminal 13a to be fixed on main electrode 11. A part of surface of resistance body is cut down by using rotary blade 15 as shown in FIG. 4F, and resistance value is adjusted if necessary. FIG. 4G is a perspective view that shows an example of fixing shunt resistor of the embodiment to bus bar 19. Bolt 21 is inserted through opening 14 formed in flatness part 12f and opening formed in bus bar 19, and is tightened and fixed with nut not shown in the figure.

Figure 5:
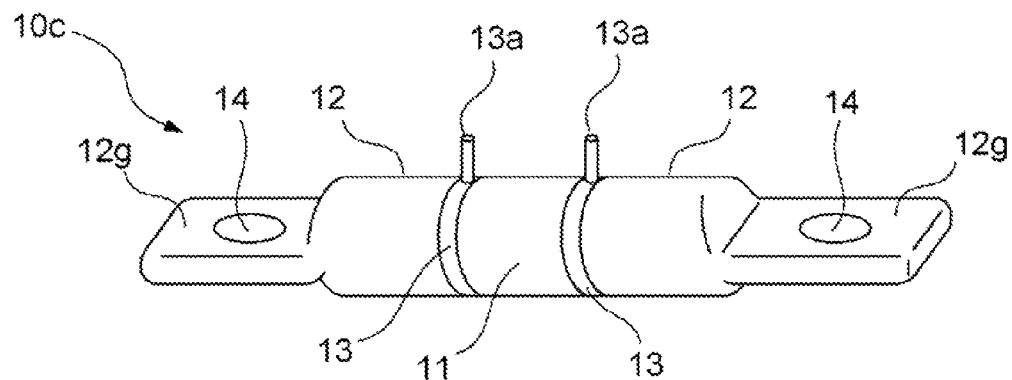
FIG. 5 is a perspective view of shunt resistor according to third embodiment.
Figure 6A:
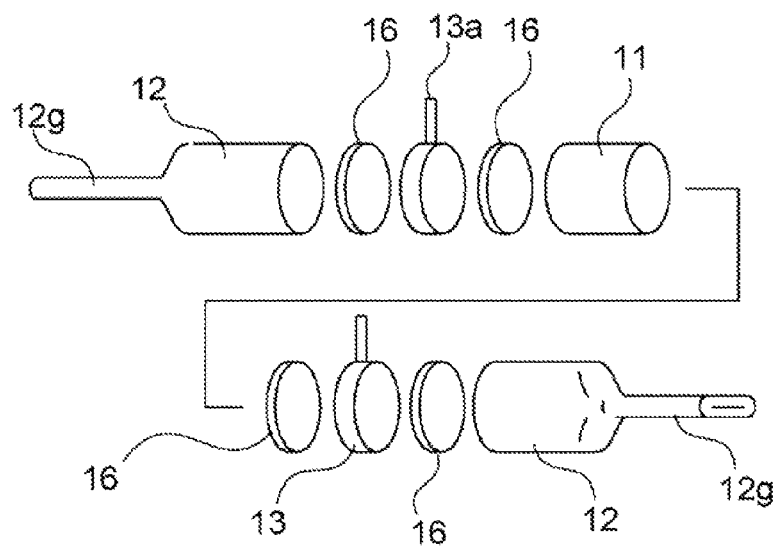
FIG. 6A is an exploded perspective view according to third embodiment.
Figure 6B:
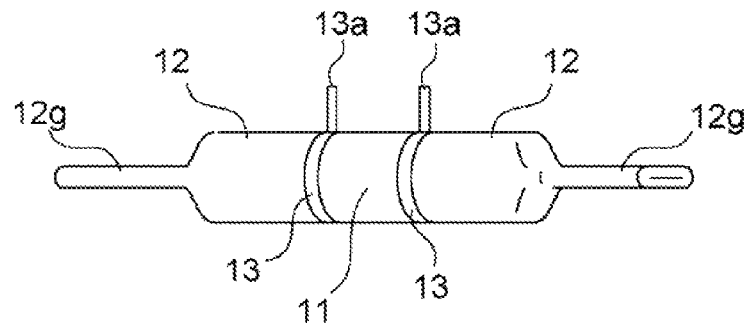
FIG. 6B is a perspective view at a finished stage of third embodiment.

FIG. 5 is shunt resistor of third embodiment of the invention. In this example, position of flatness part 12g having opening 14 is formed at almost middle part in height of the resistor. That is, the flatness part is formed at position that passes through central portion in section of the resistor. FIG. 6A and FIG. 6B show an example of the manufacturing process. First, as well as embodiment mentioned above, material that becomes resistance body, material that becomes voltage detection electrode, and material that becomes main electrode are prepared, in addition, wax material is prepared. Voltage detection electrode has detection terminal 13a. Flatness part 12g is formed beforehand at a part of main electrode 12. Opening 14 of flatness part 12g may be formed beforehand, or may be formed after connecting each material.

In third embodiment, bonding of resistance body 11, voltage detection electrode 13, and main electrode 12 is done by brazing and soldering. The brazing and soldering is a method to provide wax material 16 such as copper, silver, gold, platinum, and nickel etc. and to make bonding by applying heat. Concretely, first, as shown in FIG. 6A, by providing wax material 16 in each joint part of resistance body 11, voltage detection electrode 13, and main electrode 12, and by suppressing from both sides with jig, they are fixed. Next, they are heated to about 500° C.-900° C. in batch furnace. At the time, furnace is made to an atmosphere that can prevent metal being oxidized by filling inert gas such as argon or nitrogen, hydrogen or by making it to be vacuumed. According to this process, as shown in FIG. 6B, shunt resistor that each metal material is bonded can be formed. In the brazing and soldering, there is an advantage on the process that pressurizing is unnecessary like pressure bonding, and that bonding is easy even in case that detection terminal projecting from voltage detection electrode is installed.

Moreover, as well as before-mentioned flatness part 12f, flatness part 12g may be formed by press or cutting after bonding voltage detection electrode 13 and main electrode 12 to both end faces of resistance body 11. In this embodiment, as well as FIG. 4G, the resistor can be fixed to bus bar etc.

Figure 7:
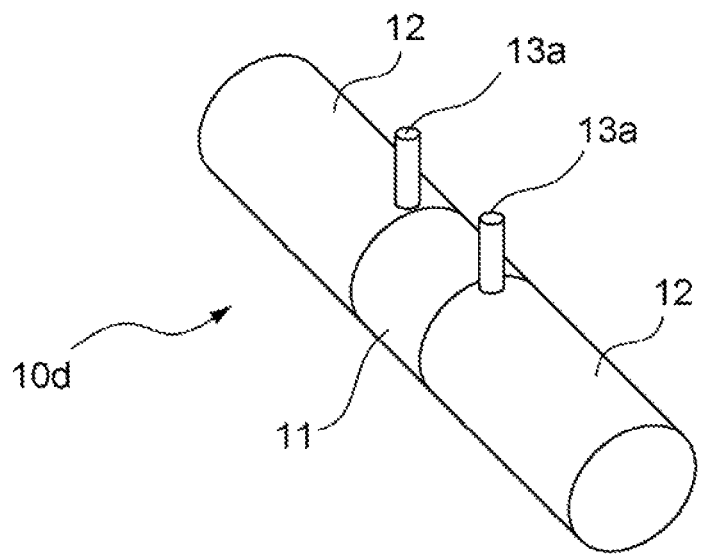
FIG. 7 is a perspective view of shunt resistor according to fourth embodiment of the invention.
Figure 8:
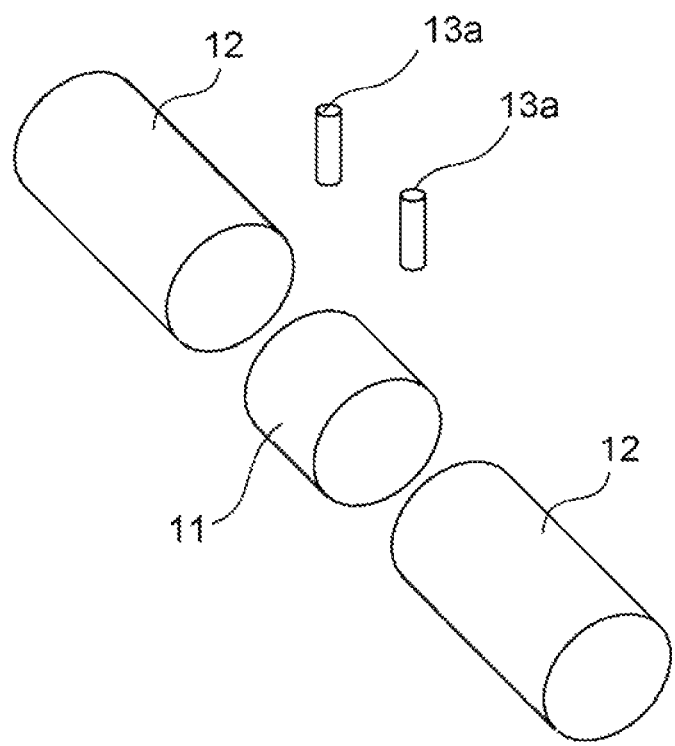
FIG. 8 is an exploded perspective view of shunt resistor according to fourth embodiment.

FIG. 7 and FIG. 8 show shunt resistor of fourth embodiment of the invention. In this embodiment, end faces of main electrodes 12,12 of columnar (rod) shape are bonded directly to both ends of resistance body 11 of columnar (rod) shape without providing the voltage detection electrode. As for bonding, pressure bonding method such as friction pressure bonding or diffusion bonding, or brazing and soldering method may be used. In case of brazing and soldering, wax material is provided between resistance body 11 and main electrode 12 and these are bonded. Afterwards, detection terminal 13a is welded to main electrode 12. Detection terminal 13a is welded at a position as close as possible to bonded interface with resistance body 11.

The shunt resistor has a feature in point that the resistor is column type. That is, resistance body 11 and main electrode 12 are column types. The columnar material is excellent in yield of the material and cheap, easy to process, and high size accuracy can be easily obtained.

Moreover, the shunt resistor has a feature in point of the structure that end faces of resistance body 11 and main electrode 12 are mutually abutted. By using diffusion bonding, friction pressure bonding, or brazing and soldering as bonding method, and by forming joint structure of end faces mutually abutted, homogeneous joint surface can be formed to all aspects of the end faces. Then, cost of materials is suppressed to minimum. Since current flows in straight line, there are a lot of advantageous points in electrical characteristics. Also, small, compact, and simple structure has been obtained.

Figure 9:
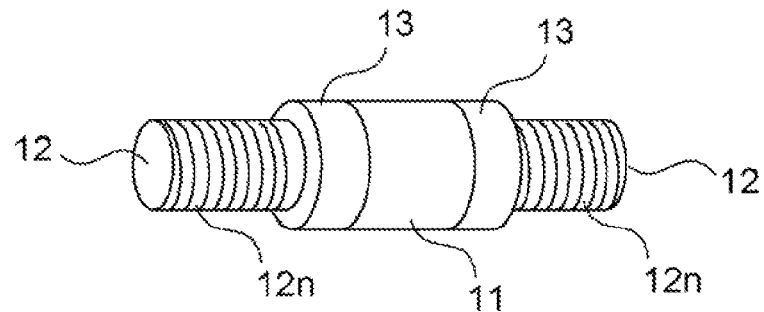
FIG. 9 is a perspective view of shunt resistor according to fifth embodiment of the invention.
Figure 10:
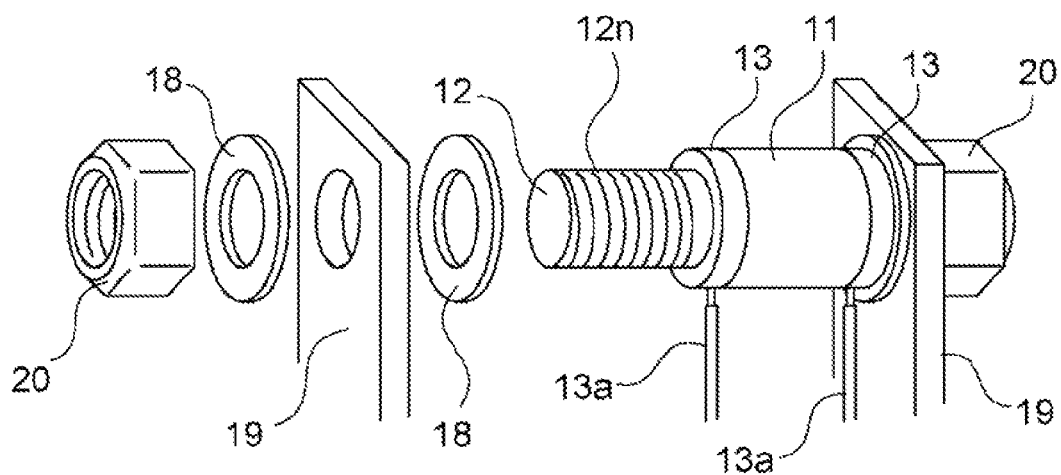
FIG. 10 is an exploded perspective view showing use situation of shunt resistor according to fifth embodiment.

FIG. 9 shows shunt resistor of fifth embodiment of the invention. In the embodiment, in addition to structure of fourth embodiment, the resistor has male screw part 12n (bolt state electrode part) where screw ditch is formed on outer surface of main electrode 12. FIG. 10 shows its use situation. By inserting male screw part 12n in each opening of washer 18, bus bar 19 connected with cable, and washer 18, and by tightening nut 20, bus bar 19 can be fixed to main electrode 12 as shown at right of the figure. And, by fixing detection terminal 13a to voltage detection electrode 13, voltage caused at both ends of resistance body 11 can be detected.

Figure 11:
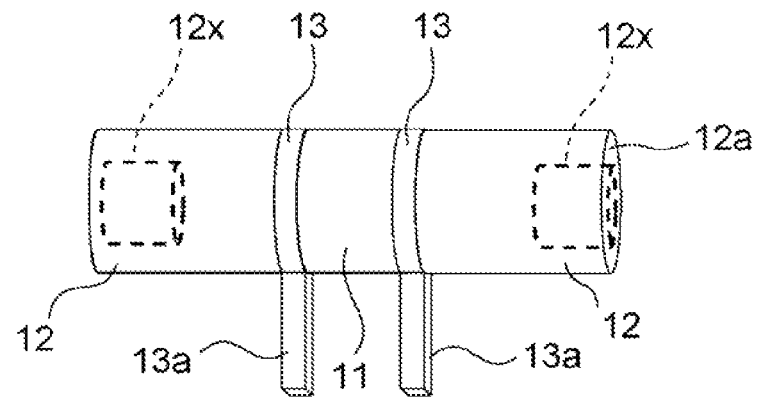
FIG. 11 is a perspective view of shunt resistor according to sixth embodiment of the invention.
Figure 12:
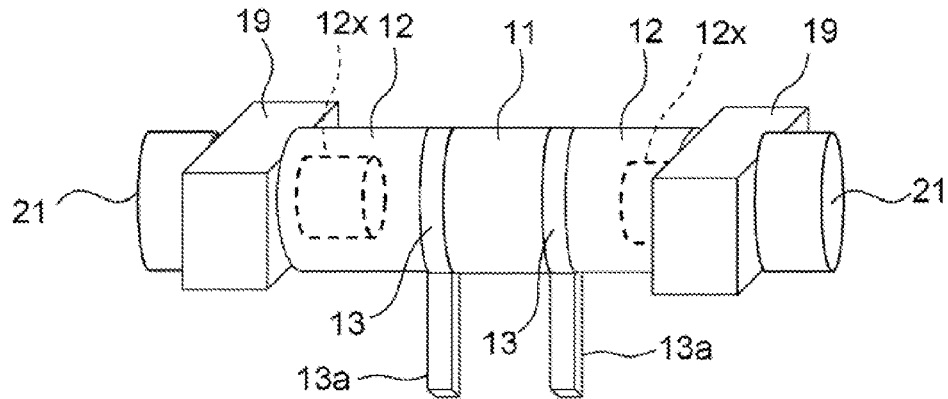
FIG. 12 is an exploded perspective view showing use situation of shunt resistor according to sixth embodiment.

FIG. 11 shows shunt resistor of sixth embodiment of the invention. In the embodiment, the resistor has a hole in end face 12a of main electrode 12 and a female screw part 12x where screw ditch is formed on inner surface of the hole. FIG. 12 shows its use situation. By inserting bolt 21 engaging with female screw part 12x through an opening (not shown) of bus bar 19, which is current pathway, and tightening bolt 21, bus bar 19 can be fixed to end face 12a of main electrode 12. And, by fixing detection terminal 13a to voltage detection electrode 13, voltage generated at both ends of resistance body 11 can be detected.

Figure 13:
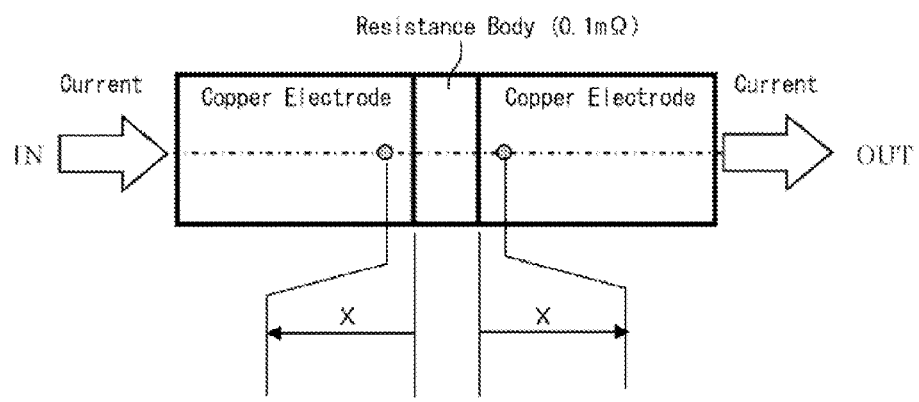
FIG. 13 is an explanatory view of voltage detection position in shunt resistor.
Figure 14A:
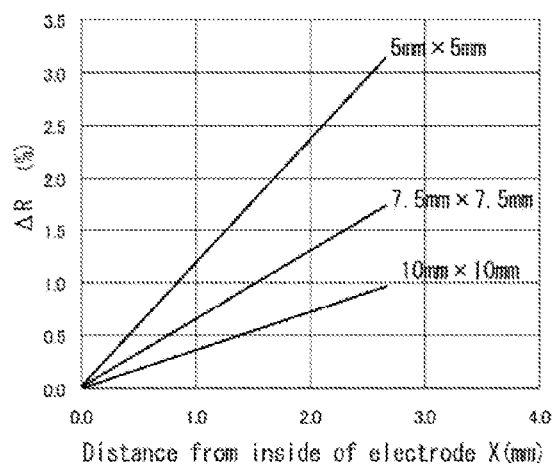
FIG. 14A is a graph of resistance change ratio at the voltage detection position.
Figure 14B:
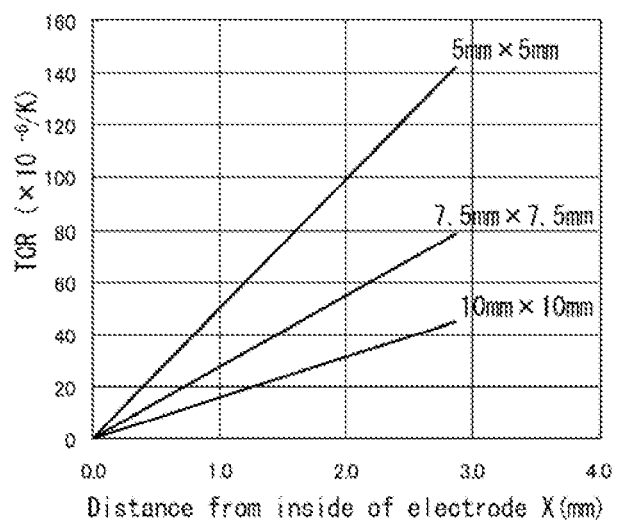
FIG. 14B is a graph of temperature coefficient of resistance change ratio at the voltage detection position.

Next, influence of voltage detection position when copper electrode is bonded to both end faces of resistance body will be explained. FIG. 13 shows a model, where both end faces of square pillar shaped resistance body of about 0.1 mΩ are bonded to square pillar shaped copper electrodes of same section size. FIG. 14A shows a simulation result of resistance value change ratio ΔR corresponding to voltage detection position (distance X from inside of electrode). And, FIG. 14B shows a simulation result of temperature coefficient of resistance corresponding to voltage detection position (distance X from inside of electrode), when assuming that temperature coefficient of resistance of the resistance body is zero.

As it is clear from these results, in case of resistance body of about 0.1 mΩ, according to increase of distance X from inside of electrode, influence of resistance element and high temperature coefficient of resistance of copper material electrode grows. And detection voltage at voltage detection position X becomes higher than voltage between both end faces of resistance body itself and temperature coefficient of resistance becomes higher than temperature coefficient of resistance of the resistance body itself. That is, it is understood that difference of voltage detection position greatly influences high accuracy voltage detection. According to shunt resistor of the invention that has the voltage detection electrode, since voltage detection position X, which is distance from inside of electrode, is fixed to be almost zero, difference of resistance value change ratio and temperature coefficient of resistance is extremely small.

In each embodiment above, any method such as pressure bonding (diffusion bonding and friction pressure bonding), brazing and soldering, laser welding, and electron beam welding, mentioned above, may be used for bonding each material of resistance body, main electrode, and voltage detection electrode. Bonding condition should be properly changed with size and material etc. to be bonded. Although embodiments of the invention has been explained, however the invention is not limited to above embodiments, and various changes and modifications may be made within scope of the technical concept of the invention.

INDUSTRIAL APPLICABILITY

The invention can be suitably used for current sensing resistor consisting of metal material, which uses resistance alloy material as resistance body, especially for the resistor of super-low resistance area of 1 mΩ or less.

The invention claimed is:
1. A shunt resistor comprising:
a rod-shaped resistance body; and
a pair of electrodes separated from the resistance body;
wherein end faces of the resistance body and the electrode are bonded;
wherein the electrode consists of a main electrode and a voltage detection electrode,
the voltage detection electrode is provided and bonded between the resistance body and the main electrode so as to have a homogenous joint face with the main electrode and with the resistance body.
2. The shunt resistor according to claim 1, wherein each joint face is abutted and bonded by pressure bonding or brazing and soldering.
3. The shunt resistor according to claim 1, wherein the voltage detection electrode has a projection part.
4. The shunt resistor according to claim 1, wherein the voltage detection electrode and the main electrode are fixed to both end faces of the resistance body in length direction so that they are opposed each other.
5. The shunt resistor according to claim 1, wherein the resistance body is columnar.
6. The shunt resistor according to claim 1, wherein the electrode has a flatness part.
7. The shunt resistor according to claim 1, wherein screw ditch is formed on outer surface of the electrode.
8. A method for manufacturing a shunt resistor, comprising:
preparing a rod-shaped resistance body and a pair of electrodes separated from the resistance body; and
abutting faces of the electrodes to both end faces of the resistance body in length direction thereof so that end faces of the electrode and the resistance body are opposed each other, and fixing them;
wherein the electrode consists of a main electrode and a voltage detection electrode,
providing the voltage detection electrodes on both end faces of the resistance body in length direction thereof; and abutting the main electrode so that a face of the voltage detection electrode and a face of the main electrode are opposed each other;
forming homogenous joint faces between the main electrode and the voltage detection electrode, and the resistance body and the voltage detection electrode.
9. The method according to claim 8, wherein the resistance body is columnar.
10. The method according to claim 8, wherein the resistance body and the electrodes are fixed by pressure bonding or brazing and soldering.

* * * * *